(12) United States Patent
Kaldani

(10) Patent No.: US 9,013,874 B2
(45) Date of Patent: Apr. 21, 2015

(54) HEAT DISSIPATION DEVICE

(75) Inventor: Givargis George Kaldani, Los Gatos, CA (US)

(73) Assignee: SK hynix memory solutions inc., San Jose, CA (US)

( * ) Notice: Subject to any disclaimer, the term of this patent is extended or adjusted under 35 U.S.C. 154(b) by 115 days.

(21) Appl. No.: 13/612,007

(22) Filed: Sep. 12, 2012

(65) Prior Publication Data

US 2014/0071614 A1     Mar. 13, 2014

(51) Int. Cl.
| | |
|---|---|
| *H05K 7/20* | (2006.01) |
| *G06F 1/20* | (2006.01) |
| *F28F 3/04* | (2006.01) |
| *F28D 15/02* | (2006.01) |

(52) U.S. Cl.
CPC .. *H05K 7/20* (2013.01); *G06F 1/20* (2013.01); *F28F 2210/10* (2013.01); *F28F 3/048* (2013.01); *F28D 15/0275* (2013.01)

(58) Field of Classification Search
CPC ...... H05K 7/20; H01L 23/473; H01L 23/427; G06F 1/20; G06F 1/1656
USPC .......... 361/679.46, 679.52, 679.54, 688, 689, 361/700–704, 709–715, 719–722; 165/80.2, 80.3, 80.4, 80.5, 104.26, 165/104.33, 185; 257/706–727; 174/15.1, 174/15.2, 16.3, 254
See application file for complete search history.

(56) References Cited

U.S. PATENT DOCUMENTS

| | | | | |
|---|---|---|---|---|
| 6,538,884 | B1 * | 3/2003 | Wong et al. | 361/688 |
| 6,717,811 | B2 * | 4/2004 | Lo et al. | 361/698 |
| 7,343,962 | B2 * | 3/2008 | Xia et al. | 165/80.3 |
| 7,369,412 | B2 * | 5/2008 | Peng et al. | 361/715 |
| 7,493,939 | B2 * | 2/2009 | Xia et al. | 165/104.26 |
| 7,520,316 | B2 * | 4/2009 | Xia et al. | 165/104.33 |
| 7,576,986 | B2 * | 8/2009 | Chou et al. | 361/700 |
| 7,637,311 | B2 * | 12/2009 | Zheng et al. | 165/80.3 |
| 7,694,718 | B2 | 4/2010 | Lai et al. | |
| 7,742,306 | B2 * | 6/2010 | Shuai et al. | 361/710 |
| 7,746,640 | B2 * | 6/2010 | Cao et al. | 361/700 |
| 7,746,642 | B2 * | 6/2010 | Lai et al. | 361/700 |
| 7,907,407 | B2 * | 3/2011 | Ho | 361/700 |
| 8,196,645 | B2 * | 6/2012 | Lai et al. | 165/104.33 |
| 8,567,483 | B2 * | 10/2013 | Kamath et al. | 165/80.3 |
| 2007/0051498 | A1 | 3/2007 | Xia et al. | |
| 2007/0074857 | A1 * | 4/2007 | Xia et al. | 165/104.33 |
| 2007/0107871 | A1 * | 5/2007 | Xia et al. | 165/80.3 |
| 2007/0107876 | A1 * | 5/2007 | Xia et al. | 165/104.26 |
| 2007/0188995 | A1 * | 8/2007 | Franz et al. | 361/704 |
| 2007/0215321 | A1 * | 9/2007 | Yang et al. | 165/80.3 |
| 2007/0258218 | A1 * | 11/2007 | Peng et al. | 361/715 |

(Continued)

FOREIGN PATENT DOCUMENTS

| | | | | |
|---|---|---|---|---|
| CN | 2919530 Y | * | 7/2007 | ............ H01L 23/367 |
| JP | 2004241450 A | * | 8/2004 | ............ F28D 15/02 |

*Primary Examiner* — Michail V Datskovskiy

(74) *Attorney, Agent, or Firm* — Van Pelt, Yi & James LLP

(57) ABSTRACT

A heat dissipation device for an electronic device includes a base, a plurality of fins and at least one heat pipe. The base has a front surface and a rear surface opposite to the front surface. A heat-generating component of the electronic device is disposed adjacent to the rear surface. The plurality of fins extend from the front surface of the base. The heat pipe is disposed on the front surface of the base and in a cutout portion of the plurality of fins. The heat dissipation device, which removes heat from the heat-generating component, has a low profile and improved heat dissipation capability.

14 Claims, 10 Drawing Sheets

(56) References Cited

U.S. PATENT DOCUMENTS

| | | | |
|---|---|---|---|
| 2008/0110594 A1* | 5/2008 | Martin et al. | 165/80.4 |
| 2008/0173430 A1* | 7/2008 | Jin et al. | 165/104.33 |
| 2008/0310122 A1* | 12/2008 | Chou et al. | 361/720 |
| 2009/0000768 A1 | 1/2009 | Zheng et al. | |
| 2009/0016023 A1* | 1/2009 | Cao et al. | 361/702 |
| 2009/0147522 A1* | 6/2009 | Shuai et al. | 362/294 |
| 2009/0151898 A1* | 6/2009 | Lai et al. | 165/80.3 |
| 2009/0211730 A1* | 8/2009 | Zhou et al. | 165/80.3 |
| 2009/0266513 A1* | 10/2009 | Xiong et al. | 165/80.3 |
| 2011/0108237 A1* | 5/2011 | Kamath et al. | 165/80.3 |
| 2012/0085520 A1 | 4/2012 | Pfaffinger | |
| 2012/0087090 A1* | 4/2012 | Feng et al. | 361/700 |

* cited by examiner

HEAT DISSIPATION DEVICE

TECHNICAL FIELD

The present disclosure relates to heat dissipation devices for removing heat from electronic devices, and more specifically to heat dissipation devices including heat sink and heat pipes.

BACKGROUND

An electronic device may include a central processing unit (CPU) or other electronic circuit, which generates a significant amount of heat during operation. A heat dissipation device may be provided at the electronic device to remove heat from the heat-generating component. The trend has been toward increasing operating speed of the electronic device while decreasing the size of the electronic device.

The typical heat dissipation device, however, has a bulky configuration, which undesirably increases the overall profile of the electronic device. Moreover, the typical heat dissipation device does not provide efficient heat dissipation to rapidly transfer heat energy away from the heat-generating component. The electronic device may be susceptible to heat failure or decreased reliability if the heat energy is not effectively removed from the heat-generating component.

SUMMARY

The present disclosure provides a heat dissipation device that has a low profile and that efficiently dissipates heat away from heat-generating components on the printed circuit board. In one form of the present disclosure, a heat dissipation device for an electronic device includes a heat-conducting base having a front surface and a rear surface opposite to the front surface, a plurality of fins extending from the front surface of the base, and at least one heat pipe disposed on the front surface.

In another form of the present disclosure, an electronic device includes a heat-conducting base including a front surface and a rear surface opposite to the front surface, a printed circuit board disposed at the rear surface of the base and including a heat-generating component, and a plurality of fins extending from the front surface of the base. At least one heat pipe is disposed at the front surface of the base.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
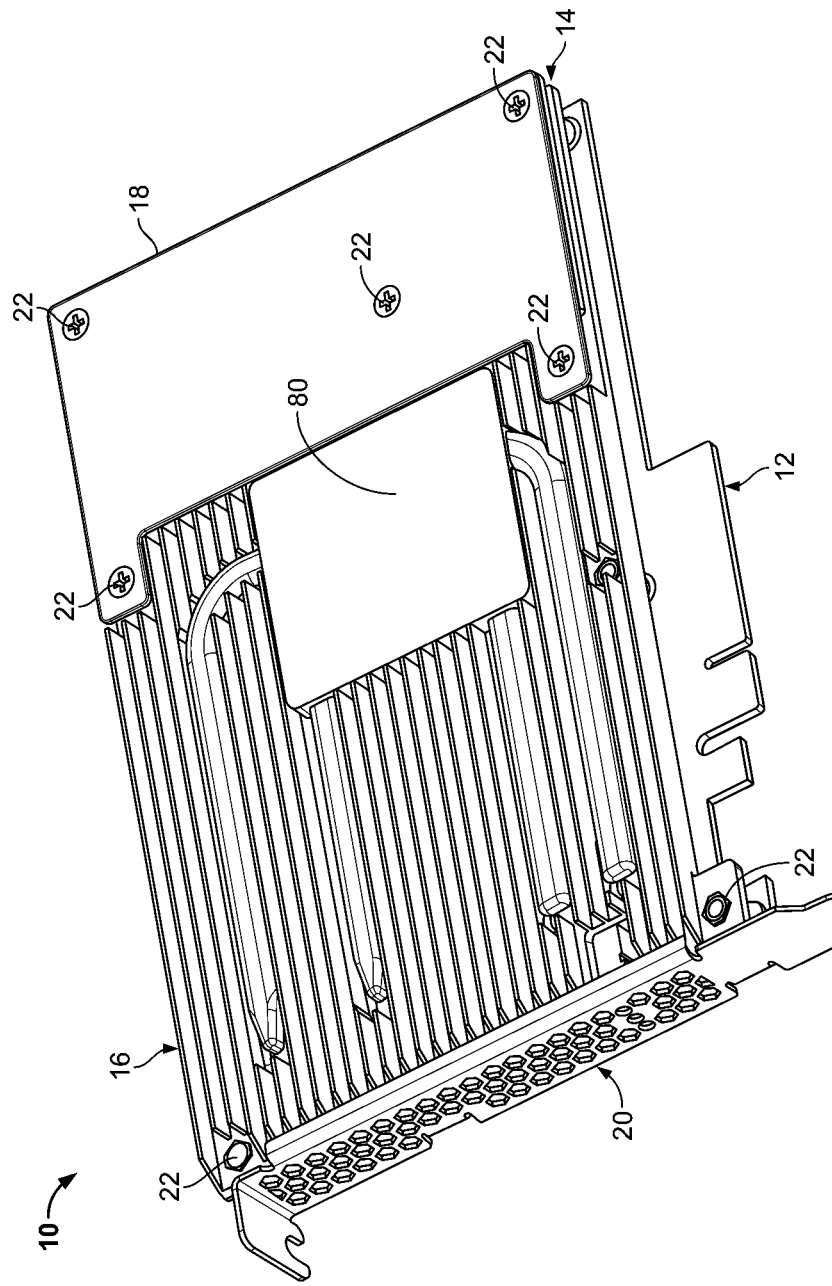
FIG. 1 is a front perspective view of an electronic device that includes a heat dissipation device constructed in accordance with the teachings of the present disclosure.

Exemplary embodiments may be better understood with reference to the drawings, but these examples are not intended to be of a limiting nature. It should be understood that throughout the drawings, corresponding reference numerals indicate like or corresponding parts and features.

Figure 2:
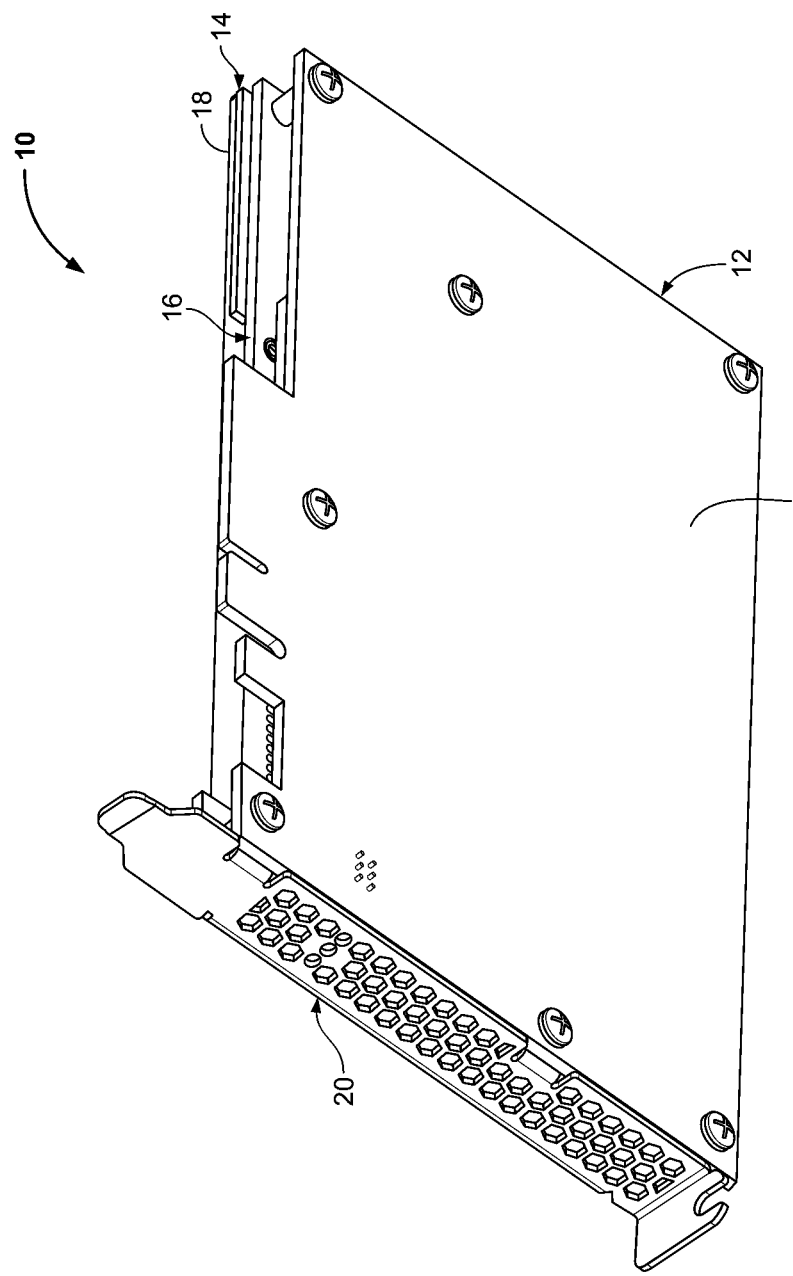
FIG. 2 is a rear perspective view of the electronic device of FIG. 1.

Referring to FIGS. 1 and 2, an electronic device 10 includes a heat dissipation device constructed in accordance with the teachings of the present disclosure is shown to have a low profile in its overall construction. More specifically, the electronic device 10 includes a first printed circuit board (such as a motherboard 12), a second printed circuit board (such as a daughterboard 14), a heat dissipation device 16 attached to the motherboard 12, and a cover 18 attached to the daughterboard 14. The daughterboard 14 is disposed between the heat dissipation device 16 and the cover 18. A mounting flange 20 is provided at one side of the motherboard 12 for mounting the electronic device 10 to a chassis (not shown) of a data processing system. The motherboard 12, the daughterboard 14, the heat dissipation device 16, and the cover 18 have corresponding holes 19 (shown in FIG. 3) through which a plurality of fasteners 22, such as screws and bolts, are inserted to connect the motherboard 12, the daughterboard 14, the heat dissipation device 16, and the cover 18 together as a unit.

Figure 3:
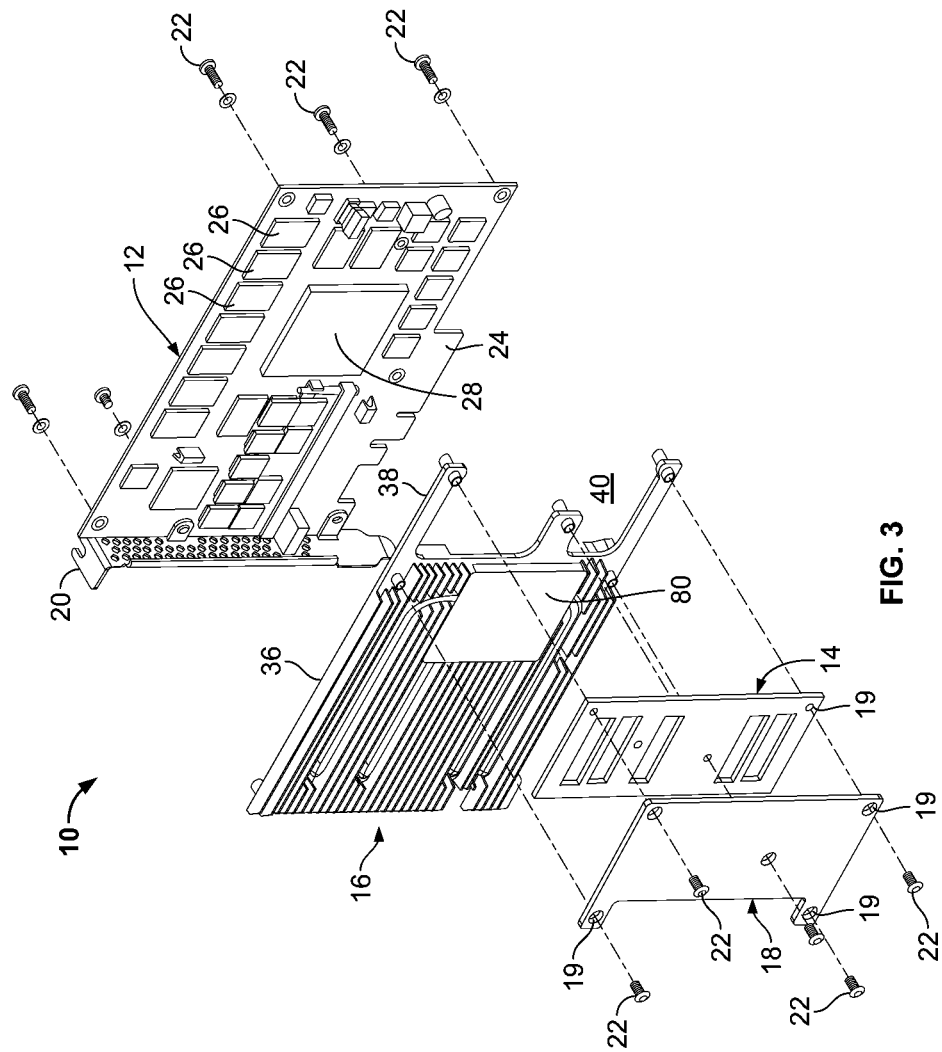
FIG. 3 is an exploded view of the electronic device of FIG. 1.

Referring to FIG. 3, the motherboard 12 includes a front surface 24 on which a plurality of electronic components 26 and a main heat-generating component, such as a central processing unit (CPU) 28, are provided, and a rear surface 30 (shown in FIG. 2) opposite to the front surface 24. The plurality of electronic components 26 may also generate heat during operation. The heat dissipation device 16 is disposed adjacent to the front surface 24 of the motherboard 12 for removing heat away from the motherboard 12, particularly the CPU 28 and the plurality of electronic components 26.

Figure 4:
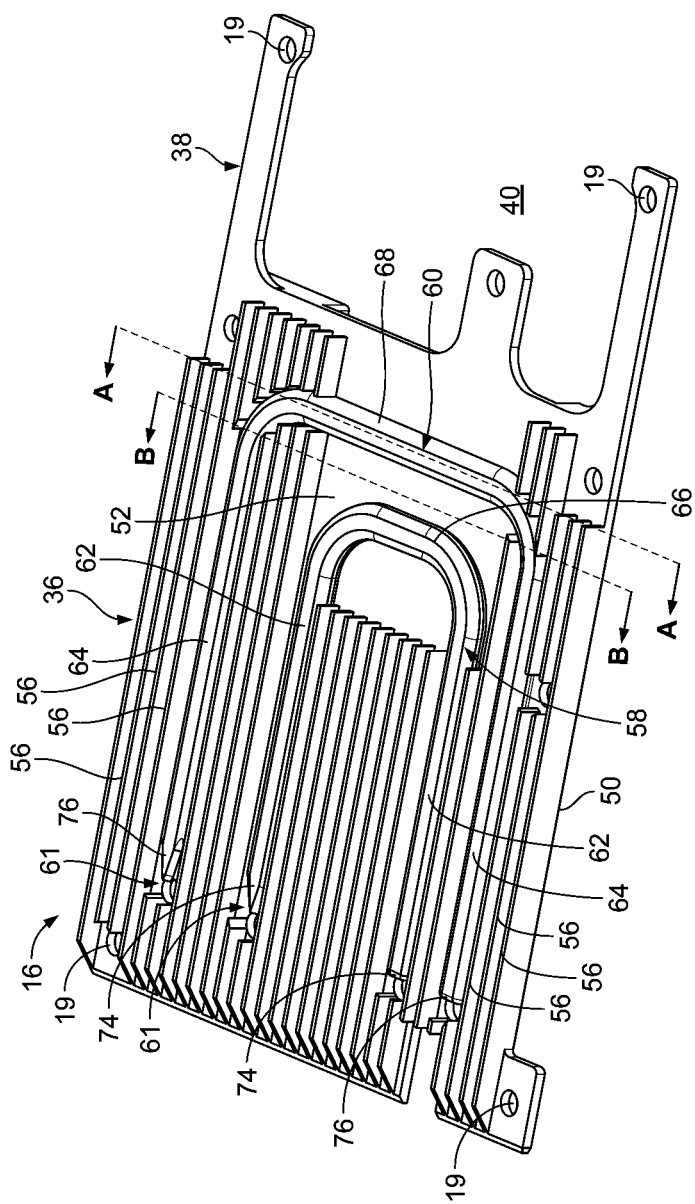
FIG. 4 is a front perspective view of a heat dissipation device constructed in accordance with the teachings of the present disclosure.
Figure 5:
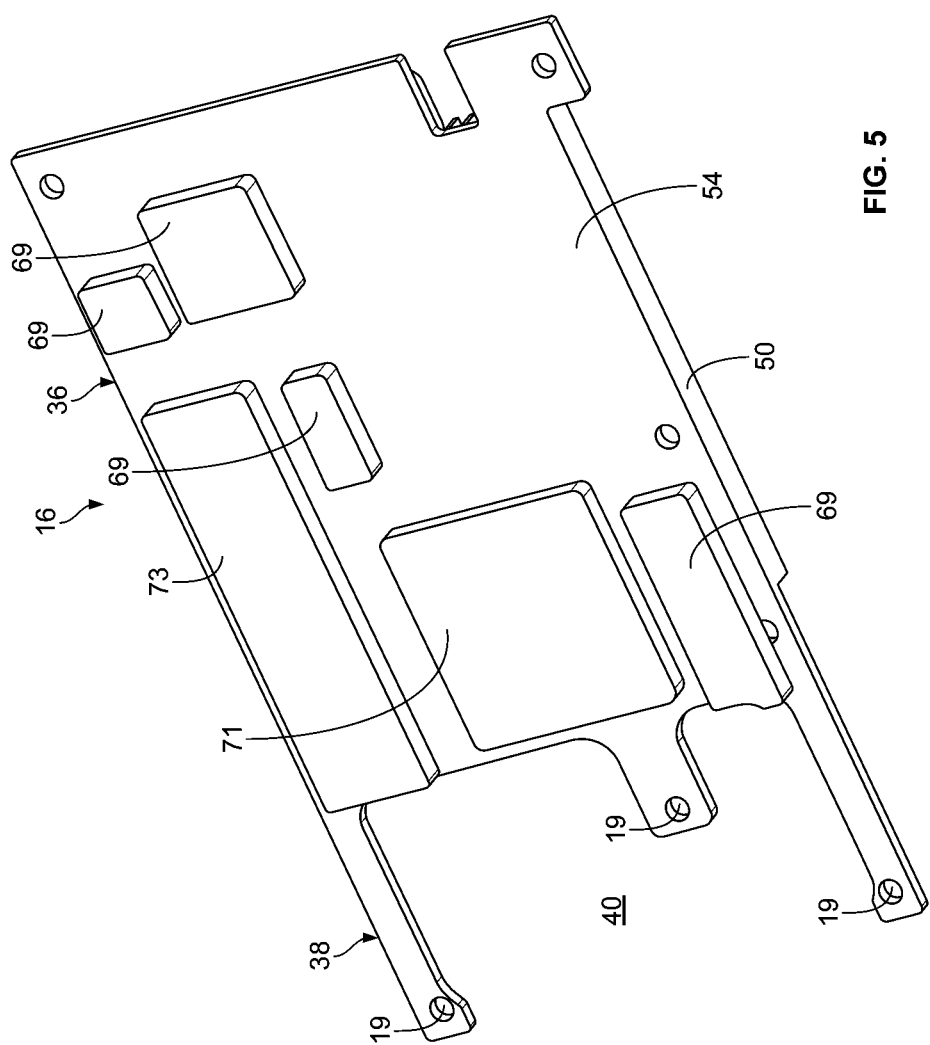
FIG. 5 is a rear perspective view of a heat dissipation device constructed in accordance with the teachings of the present disclosure.

Referring to FIGS. 4 and 5, the heat dissipation device 16 includes a heat dissipating portion 36 for contacting and dissipating heat away from the plurality of electronic components 26 and the CPU 28, and a mounting portion 38 for mounting the daughterboard 14 and the cover 18 to the motherboard 12. The mounting portion 38 defines an opening 40. The electronic components, circuits or connectors (not shown) on the daughterboard 14 protrude through the opening 40 to contact the corresponding components/circuits/connectors on the motherboard 12 to establish electrical connection between the motherboard 12 and the daughterboard 14.

The heat dissipating portion 36 includes a base 50 having a front surface 52 and a rear surface 54 opposite to the front surface 52, a plurality of fins 56 extending from the front surface 52, a first heat pipe 58 and a second heat pipe 60. The base 50 is made of a heat-conducting material for conducting heat away from the plurality of electronic components 26 and the CPU 28. The plurality of fins 56 define cutout portions 61 corresponding to the heat pipes 58 and 60 such that at least one of the first and second heat pipes 58 and 60 are disposed on the front surface 52 of the base 50 and in the cutout portions 61.

The first and second heat pipes 58 and 60 each have a substantially U-shape configuration and include a pair of straight sections 62, 64 and a curved section 66, 68 between the pair of straight sections 62, 64. In an alternative, at least one of the first heat pipe 58 or the second heat pipe 60 may be disposed, at least in part, between adjacent fins 56.

The curved sections 66, 68 of the first and second pipes 58 and 60 may be disposed above the main heat-generating component, e.g., the CPU 28. The first and second heat pipes 58 and 60 are filled with a phase changeable fluid, such as water, alcohol, acetone, to efficiently absorb and release heat by way of phase transition. The phase changeable fluid is sealed within the heat pipes 58 and 60. The curved sections 66, 68 function as a hot interface, configured such that the liquid in the hot interface can be easily vaporized upon receiving heat from the CPU 28. Portions of the straight sections 62, 64 function as a cold interface. The vapor generated at the curved sections 66, 68 flows toward the straight sections 62, 64 and is condensed into liquid, thereby releasing latent heat at the straight sections 62 and 64. The condensed liquid then returns to the curved sections 66 and 68 by, for example, capillary action or gravity action. The vapor can be condensed into a liquid along the straight sections 62 and 64 depending on applications. For example, the coldest area of the straight sections 62 and 64 may not be necessarily at the free ends 76 of the straight sections 62 and 64 if one of the electronic components 26 is disposed immediately below the free ends 76. At any rate, the curved sections 66 and 68 are disposed immediately above the main heat-generating component, i.e., the CPU 28 and absorb most of the heat from the motherboard 12. Therefore, vapor is generated at the curved sections 66 and 68 which have the highest temperature and then condensed at the portions of the straight sections 62 and 64 which have a temperature lower than the curved sections 66 and 68, which are in the hot zone, defined approximately by the cover plate 80. The evaporation-condensation process continuously absorbs heat from the CPU 28 at the curved sections 66 and 68 and releases heat at the straight sections 62, 64. As an example, the fluid can be water, however other working fluids such as methanol may be used depending on the application and operating temperatures. The working principle of the heat pipes is known in the art and thus the detailed description thereof is omitted herein for clarity.

As shown in FIG. 5, a plurality of protrusions 69, 71, 73 extend from the rear surface 54 of the base 50 for contacting the plurality of electronic components 26 and the CPU 28 on the motherboard 12. The size and shape of the protrusions 69, 71, 73 may be configured to correspond to the size and shape of the electronic components 26 and the CPU 28. For example, the number of the protrusions 69, 71, 73 may be equal to the number of the electronic components 26 and CPU 28 on the motherboard 12. Alternatively, as clearly shown in FIG. 5, the protrusion 73 has an elongated shape and may be used to contact multiple electronic components 26. As further shown, the protrusion 71 has an enlarged area for contacting the main heat-generating component, which may be, for example, the CPU 28. The protrusions 69, 71, 73 are configured to contact and conduct heat away from the electronic components 26 and the CPU 28. The heat absorbed by the plurality of protrusions 69, 71, 73 is spread to the entire base 50, and is further dissipated by the plurality of fins 56. The base 50 functions as a heat spreader. The plurality of fins 56 are configured to have increased contact area with surrounding air and thus function as a heat sink. The plurality of fins 56 dissipate not only the conductive heat from the base 50, but also the radiative and conductive heat from the heat pipes 58 and 60.

Figure 6:
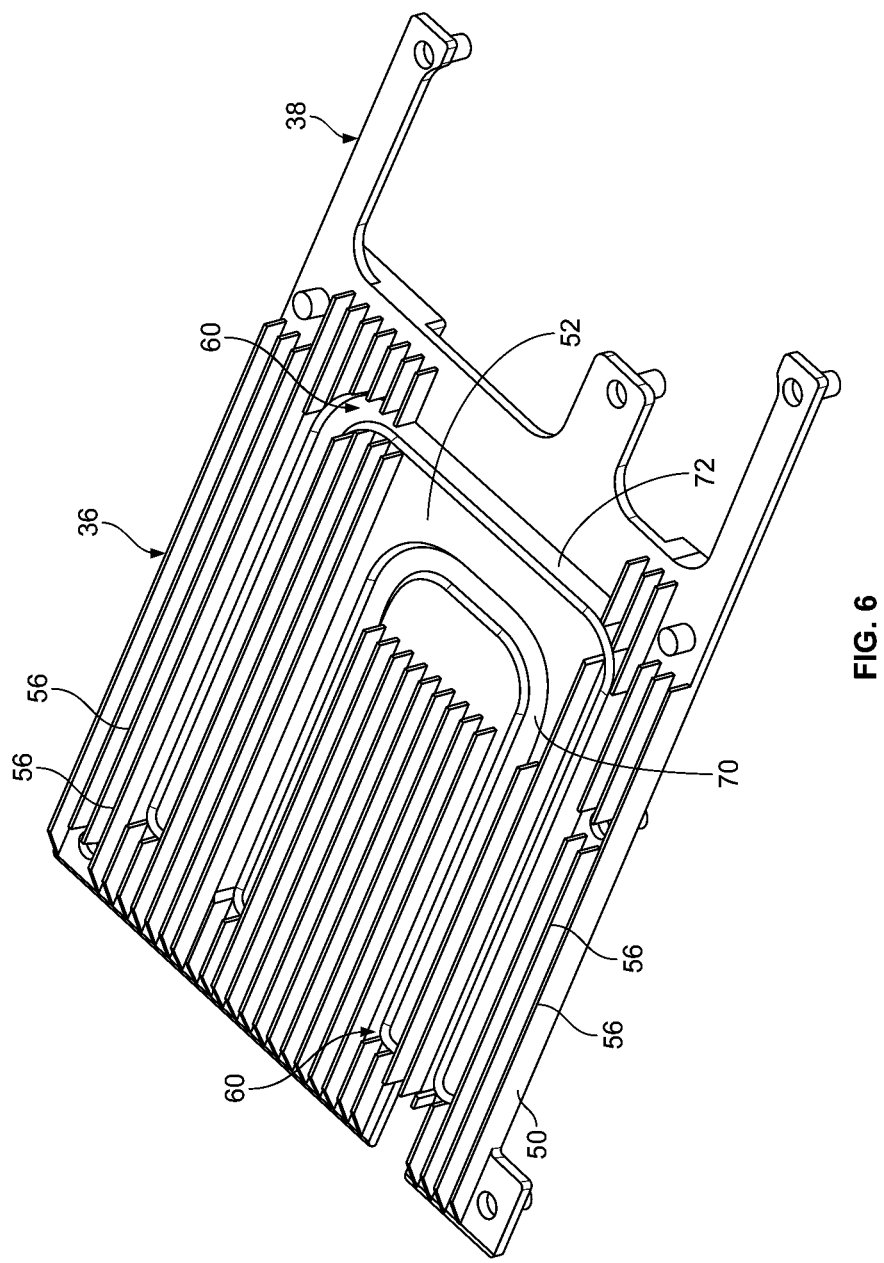
FIG. 6 is a front perspective view of a heat dissipation device constructed in accordance with the teachings of the present disclosure, wherein heat pipes are removed for clarity.

Referring to FIG. 6, the front surface 52 of the base 50 defines a first groove 70 and a second groove 72 for positioning and receiving the first heat pipe 58 and the second heat pipe 60, respectively. The first groove 70 and the second groove 72 are configured to have a depth such that the first and second heat pipes 58 and 60 are partially or completely disposed in the base 50 to further reduce the heat transfer distance between the first and second heat pipes 58 and 60 and the protrusions 69, 71, 73. Contact between the heat pipes 58, 60 and the base 50 may be facilitated by a thermally conductive material disposed therebetween. Moreover, the grooves 70 and 72 may not extend along the full length of the hear pipes 58 and 60, but may be omitted in portions of the straight sections so as to manage the heat transfer in the overall system.

Figure 7:
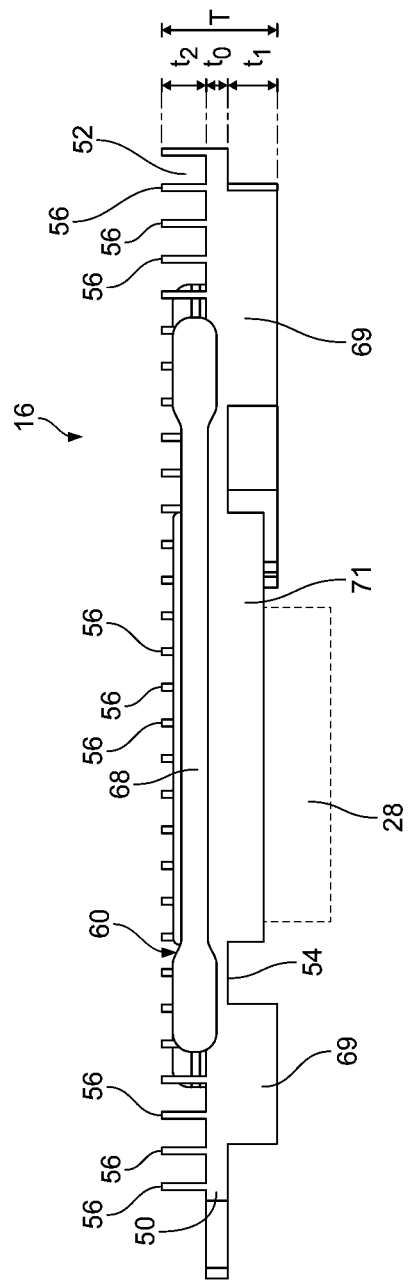
FIG. 7 is a cross-sectional view of a heat dissipation device constructed in accordance with the teachings of the present disclosure, taken along line A-A of FIG. 4.
Figure 8:
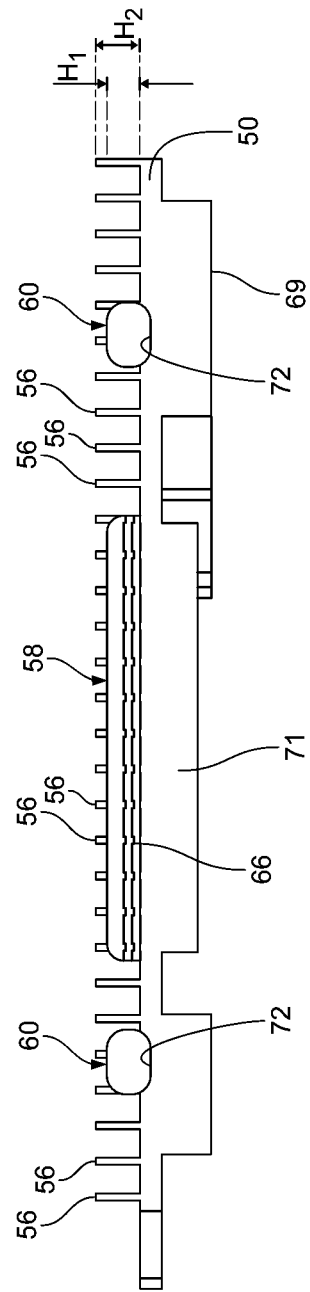
FIG. 8 is a cross-sectional view of a heat dissipation device constructed in accordance with the teachings of the present disclosure, taken along line B-B of FIG. 4.

Referring to FIGS. 7 and 8, the first and second heat pipes 58 and 60 are disposed at the front surface 52 of the base 50 and protrude into the base 50 where a groove or depressed area is provided in the base 50. The first and second heat pipes 58 and 60 may be bonded to the base 50 by, for example, soldering or epoxy or other adhesive or compound which may have heat conductive properties, to ensure effective heat conduction from the base 50 to the heat pipes 58 and 60. The first and second heat pipes 58 and 60 may have a height H1 measured from the front surface 52, which is less than the height H2 (or thickness t2) of the fins 56 measured from the front surface 52. As a result, the heat pipes 58 and 60 may not increase the thickness of the heat dissipation device 16. The thickness T of the heat dissipation device 16 is the sum of the thickness t0 of the base 50, the thickness t1 of the protrusions 69 and the thickness t2 (or height H2, shown in FIG. 8) of the fins 56. Therefore, the heat dissipation device 16 has a low profile. In an alternative, the heat pipes 58, 60 may be depressed below the maximum height of the fins 56 above the base 50 or extend above the maximum height of the fins 56 above the base 50, depending on the details of the design.

Moreover, the grooves 70 and 72 for receiving the heat pipes 58 and 60 may be recessed from the front surface 52 of the base 50 such that the heat pipes 58 and 60 are disposed closer to the protrusions 69, 71, 73. When the heat is conducted from the CPU 28 and the plurality of electronic components 26 to the protrusions 69, 71, 73, the heat pipes 58 and 60 can more effectively absorb the heat from the protrusions 69, 71, 73 before the heat is spread to other parts of the base 50.

Moreover, when the heat pipes 58 and 60 and the plurality of fins 56 may be disposed on a same surface, the effectiveness of the heat dissipation may be further improved by using a fan that generates airflow adjacent to the front surface 52. The fan (not shown) may be disposed in the equipment housing so as to direct air along the surface of the base 50, and the air may be channeled between adjacent assemblies 10 and between the base 50 and the motherboard 12. Further, portions of the heat pipes 58 and 60 may be exposed to the surrounding air and thus can further dissipate heat by radiation, in addition to release of latent heat by phase change.

Therefore, the heat dissipation device 16 of the present disclosure has improved heat dissipation capability while maintaining a low physical profile.

Optionally, as shown in FIGS. 1 and 3, an auxiliary cover 80 may be provided to cover the curved sections 66, 68 of the heat pipes 58 and 60 to further conduct heat away from the heat pipes 58 and 60 and/or the base 50. The cover 18, which is disposed adjacent to the CPU 28, can be made of a heat-conducting material and can also improve heat dissipation.

Figure 9:
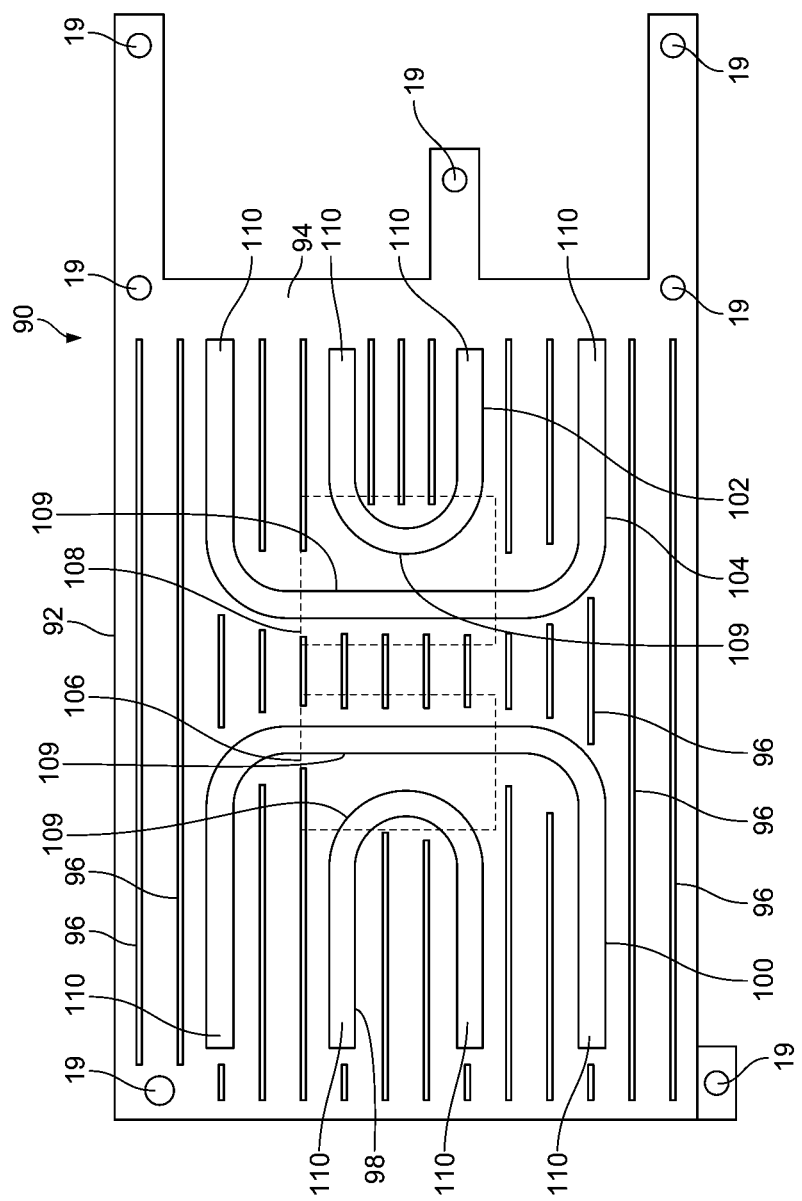
FIG. 9 is a top view of a variant of a heat dissipation device constructed in accordance with the teachings of the present disclosure.

Referring to FIG. 9, a heat dissipation device 90 according to a second embodiment of the present disclosure is similar to that of FIG. 1 except that the heat dissipation device 90 has two sets of first and second heat pipes. More specifically, the heat dissipation device 90 includes a base 92 having a front surface 94, a plurality of fins 96, a first set of first and second heat pipes 98 and 100 and a second set of first and second heat pipes 102 and 104. The first set of first and second heat pipes 98 and 100 absorb heat from a first heat-generating component, such as CPU (not shown) through a first protrusion 106. The second set of first and second heat pipes 102 and 104 absorb heat from a second heat-generating component, such as CPU (not shown) through a second protrusion 108. The first and second protrusions 106 and 108, which are shown in dashed lines in FIG. 9, extend from a rear surface (not shown) of the base 92 opposite to the front surface 94 for contacting the first and second heat-generating components. The first set and the second set of first and second heat pipes 98, 100, 102, 104 each have a curved section 109 disposed immediately above the first and second protrusions 106 and 108. Therefore, the curved sections 109 function as a hot interface for absorbing heat from the first and second heat-generating components through the first and second protrusions 106 and 108. The heat is released at the straight sections 110 of the first and second heat pipes 90, 100, 102 and 104 as the straight sections 110 function as a cold interface where the vapor is condensed into liquid, thereby releasing latent heat.

Figure 10:
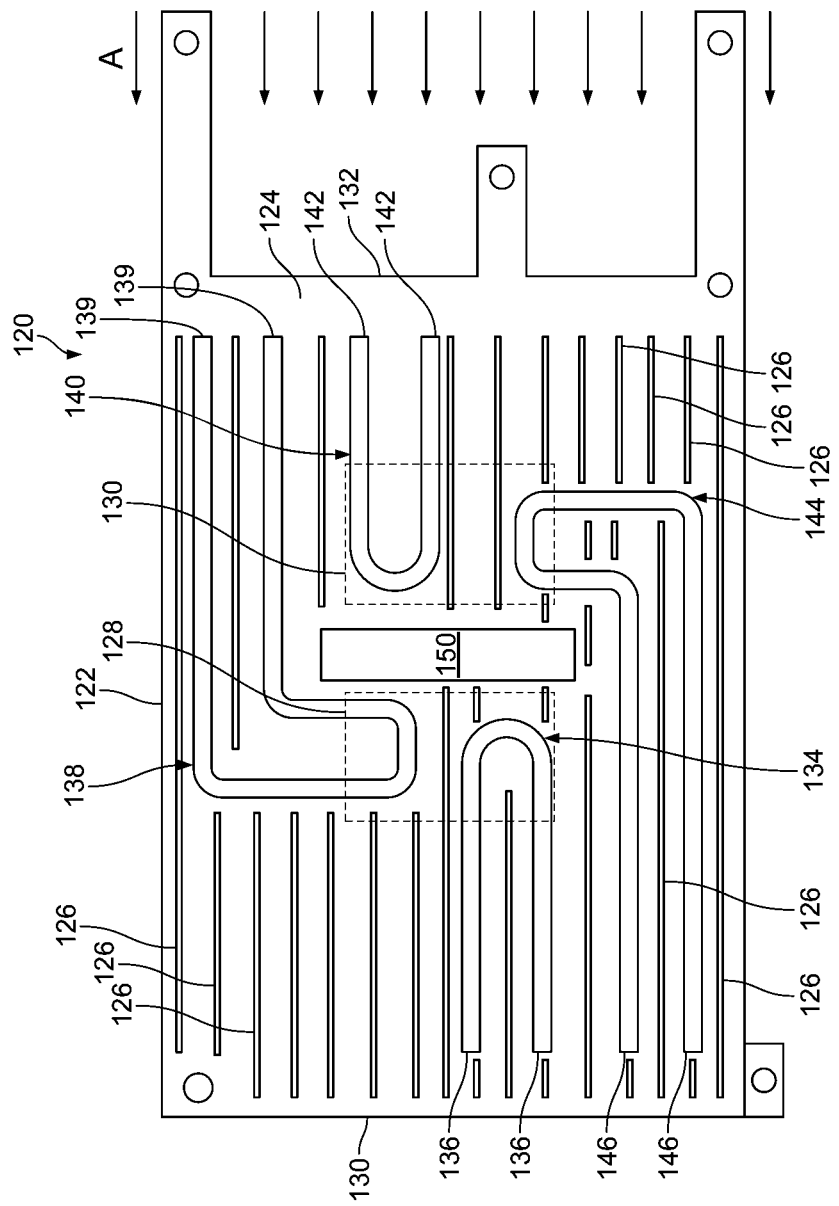
FIG. 10 is a top view of another variant of a heat dissipation device constructed in accordance with the teachings of the present disclosure.

Referring to FIG. 10, a heat dissipation device 120 according to a third embodiment of the present disclosure is similar to that the second embodiment except for the orientation of the heat pipes and provision of an opening in the base. More specifically, the heat dissipation device 120 includes a base 122 having a front surface 124, a plurality of fins 126 extending from the front surface 124, a first set of heat pipes corresponding to a first protrusion 128, and a second set of heat pipes corresponding to the second protrusions 130. The first and second sets of heat pipes are provided on the front surface 124 of the base 122. The first and second protrusions 128 and 130, shown in dashed lines in FIG. 10, extend from a rear surface (not shown) of the base 122 for contacting a first heat-generating component and a second heat-generating component (not shown), respectively. The base 122 defines a first side 130 distal from a fan (not shown) that generates air flow as indicated by arrows A and a second side 132 opposite to the first side 130 and adjacent to the fan.

The first set of heat pipes include a shorter heat pipe 134 having free ends 136 adjacent to the first side 130 and a longer heat pipe 138 having free ends 139 adjacent to the second side 132. The second set of heat pipes include a shorter pipe 140 having free ends 142 adjacent to the second side 132 and a longer pipe 144 having free ends 146 adjacent to the first side 130. In other words, the first and second sets of heat pipes each have two free ends located adjacent to the first side 130 and two free ends located adjacent to the second side 132. In the first set of heat pipes, the longer pipe 138, which absorbs and releases more heat than the shorter pipe 134, is disposed closer to the fan. In the second set of heat pipes, the longer pipe 144, which absorbs and releases more heat than the shorter pipe 140, is disposed away from the fan. By this arrangement, although the hot interfaces (e.g., the curved sections) of the first set of heat pipes are disposed distal from the fan, the longer pipe 138 of the first set of heat pipes is disposed close to the fan to compensate the less-effective heat dissipation at the curved sections of the first set of heat pipes due to their longer distance from the fan. Therefore, the first and second sets of heat pipes can more uniformly release heat to the surrounding air and the first and second heat-generating components can be more uniformly cooled.

The base 122 may define an opening 150 between the first and second protrusions 128 and 130 to isolate a first hot zone from a second hot zone. Therefore, the heat absorbed by the first protrusion 128 from the first heat-generating component is spread toward the first side 130 of the base 122, rather than toward the second heat-generating component. The heat absorbed by the second protrusion 130 from the second heat-generating component is spread toward the second side 132 of the base 122, rather than toward the first heat-generating component.

The heat pipes are shown having a curved section disposed proximal to a heat generating component, and a straight section where the heat energy is transferred from the heat pipes to the base 50, fins 56, or to the air. However, the heat pipes may be straight, or have other shapes in plan view without departing from the teachings of this disclosure.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A heat dissipation device for an electronic device, comprising:
    a base having a front surface and a rear surface opposite to the front surface;
    a plurality of fins extending from the front surface of the base;
    a first set of two or more heat pipes and a second set of two or more heat pipes, wherein:
        the first set of heat pipes and the second set of heat pipes are disposed on the front surface; and
        a phase changeable fluid is sealed in the first set of heat pipes and the second set of heat pipes; and
    a first protrusion and a second protrusion extending from the rear surface of the base for absorbing heat from a first heat-generating component and a second heat-generating component, respectively.

2. The heat dissipation device of claim 1, wherein the first set of heat pipes absorb heat from the first protrusion and the second set of heat pipes absorb heat from the second protrusion.

3. The heat dissipation device of claim 1, wherein the base includes an opening between the first and second protrusions.

4. The heat dissipation device of claim 1, wherein the phase changeable fluid includes one or more of the following: water, alcohol, acetone, or methanol.

5. The heat dissipation device of claim 1 further comprising a first set of two or more grooves in the base and a second set of two or more grooves in the base, wherein the first set of heat pipes is at least partially disposed in the first set of grooves and the second set of heat pipes is at least partially disposed in the second set of grooves.

6. The heat dissipation device of claim 1, wherein the height, as measured from the front surface, of the first set of heat pipes and the second set of heat pipes is less than the height, as measured from the front surface, of the plurality of fins.

7. The heat dissipation device of claim 1, wherein:
the first set of heat pipes includes a first U-shaped heat pipe and a second U-shaped heat pipe, wherein the first U-shaped heat pipe and the second U-shaped heat pipe are disposed on the front surface such that they have a same axis of symmetry; and
the second set of heat pipes includes a third U-shaped heat pipe and a fourth U-shaped heat pipe, wherein the third U-shaped heat pipe and the fourth U-shaped heat pipe are disposed on the front surface such that they have a same axis of symmetry.

8. The heat dissipation device of claim 1, wherein at least one of (1) the first heat-generating component or (2) the second heat-generating component includes a central processing unit (CPU).

9. The heat dissipation device of claim 1, wherein:
at least one pipe in the first set of heat pipes includes a curved section that is disposed over the first protrusion; and
at least one pipe in the second set of heat pipes includes a curved section that is disposed over the second protrusion.

10. The heat dissipation device of claim 1 further comprising a fan that blows air from a first side of the front surface towards a second side of the front surface.

11. The heat dissipation device of claim 1, wherein:
the first set of heat pipes includes a first shorter heat pipe and a first longer heat pipe, wherein the first longer heat pipe is longer than the first shorter heat pipe; and
the second set of heat pipes includes a second shorter heat pipe and a second longer heat pipe, wherein the second longer heat pipe is longer than the second shorter heat pipe.

12. The heat dissipation device of claim 1, wherein:
the first set of heat pipes includes a first heat pipe, having two ends, and a second heat pipe, having two ends, wherein the two ends of the first heat pipe point toward a first side of the front surface and the two ends of the second heat pipe point toward a second side of the front surface; and
the second set of heat pipes includes a third heat pipe, having two ends, and a fourth heat pipe, having two ends, wherein the two ends of the third heat pipe point toward the first side of the front surface and the two ends of the fourth heat pipe point toward the second side of the front surface.

13. The heat dissipation device of claim 10, wherein:
the first set of heat pipes includes a first shorter heat pipe and a first longer heat pipe, wherein the first longer heat pipe is longer than the first shorter heat pipe; and
the second set of heat pipes includes a second shorter heat pipe and a second longer heat pipe, wherein the second longer heat pipe is longer than the second shorter heat pipe.

14. The heat dissipation device of claim 13, wherein:
the first longer heat pipe is disposed closer to the fan than the first shorter heat pipe; and
the second shorter heat pipe is disposed closer to the fan than the second longer heat pipe.

* * * * *